United States Patent [19]

Kim

[11] Patent Number: 5,710,516

[45] Date of Patent: Jan. 20, 1998

[54] INPUT LOGIC SIGNAL BUFFER CIRCUITS

[75] Inventor: Chul-soo Kim, Suwon, Rep. of Korea

[73] Assignee: Samsung Electronics Co., Ltd., Suwon, Rep. of Korea

[21] Appl. No.: 639,922

[22] Filed: Apr. 24, 1996

[30] Foreign Application Priority Data

Apr. 24, 1995 [KR] Rep. of Korea .................... 95-9639

[51] Int. Cl.$^6$ ............................................. H03K 19/0175
[52] U.S. Cl. ............................ 326/115; 326/17; 326/86; 326/121
[58] Field of Search ............................ 326/17, 31, 63, 326/83, 86, 115, 121; 327/52, 53, 54

[56] References Cited

U.S. PATENT DOCUMENTS

| | | | |
|---|---|---|---|
| 5,408,146 | 4/1995 | Nguyen et al. | 326/115 X |
| 5,440,248 | 8/1995 | Brown et al. | 326/121 X |
| 5,444,396 | 8/1995 | Soneda | 326/121 X |

*Primary Examiner*—David R. Hudspeth
*Attorney, Agent, or Firm*—Myers, Bigel, Sibley & Sajovec, L.L.P.

[57] ABSTRACT

An input logic signal buffer circuit includes a differential amplifier which is responsive to an input logic signal and to a reference signal, to produce an output logic signal at an output node thereof. The input logic signal buffer circuit also includes a bypass amplifier which is electrically connected between the output logic signal and the output node. The bypass amplifier supplies additional current to the output node in response to logic level transitions of the input logic signal. The bypass amplifier preferably is a field effect transistor, the gate of which is electrically connected to the input logic signal and the source and drain of which are serially connected between the output node and a current limiting resistor. Logic level transitions with reduced delays, particularly at low power supply voltages, are thereby provided.

18 Claims, 4 Drawing Sheets

INPUT LOGIC SIGNAL BUFFER CIRCUITS

FIELD OF THE INVENTION

This invention relates to microelectronic devices, and more particularly to differential buffer circuits for input logic signals.

BACKGROUND OF THE INVENTION

Input logic signal buffer circuits are widely used in integrated circuit chips to buffer input logic signals which are obtained from off-chip, to buffer input logic signals to off-chip or to buffer input logic signals within a chip. An input logic signal buffer circuit generally includes a differential amplifier which is responsive to an input logic signal and to a reference signal to produce an output logic signal at an output node thereof.

FIG. 1 is a circuit diagram of a conventional input buffer circuit of a differential amplifier type. A current source transistor M1 is electrically connected between a first reference voltage (here shown as power supply voltage LVcc) and a first node N1. Second and third complementary field effect transistors M2 and M4 include sources and drains which are serially electrically connected between the first node N1 and a second reference voltage (here ground voltage 10), to define a second node (not labelled in FIG. 1) therebetween, wherein the gate of the second transistor M2 is electrically connected to a third reference voltage (Vref). Fourth and fifth complementary field effect transistors M3 and M5 include sources and drains which are serially electrically connected between the first node N1 and the second reference voltage 10 to define a third node N2 therebetween. The gate of the fourth transistor M3 is electrically connected to an input logic signal (VIN). The gates of the third and fifth transistors (M4 and M5) are electrically connected to the second node.

Accordingly, in the circuit diagram of FIG. 1, the first transistor M1 acts as a current source, and the third and fifth transistors M4 and M5 act as load transistors. The circuit of FIG. 1 also includes buffering units, such as operational amplifiers G1 and G2, which buffer the third node and connect the third node to an external circuit. The input logic signal buffer circuit of FIG. 1 differentially amplifies the reference voltage Vref and the input signal VIN and to convert the differentially amplified result to CMOS or other logic levels at Vout.

With the increasing importance of low power and portable electronic systems, power supply voltages of 5V are being lowered to 3.3V or less. Often, systems includes a mixture of 5V and 3.3V circuits so that an interface between circuits having different power supply voltages may be necessary. For example, memory devices may operate with circuit power supplies of 3.3V, but microprocessors or other devices may use 5V power supplies. Accordingly, it is important to provide an input buffer in a memory device which can interface with 5V and lower power supply voltages without degradation.

Unfortunately, in the input logic signal buffer circuit of FIG. 1, the operational speed degrades dramatically for lower power supply voltages. For example, as power supply voltages decrease to 3.3V and below, the delay time of the input logic signal buffer of FIG. 1 may increase dramatically. The delay may be produced because the load transistor M5 which pulls down the voltage of node N2 to a low level, acts as a current mirror during the rising transition of the input logic signal, when the circuit operates at low power supply voltages. This reduction in performance may adversely impact the performance of the entire system in which the input logic signal buffer circuit is used.

As graphically illustrated in FIG. 5, the current flowing in a conventional buffer may be 250 µA for a power supply voltage of 4.3V, but is generally dramatically reduced to about 10 µA for a power supply voltage of 2.3V. This low performance generally causes the output signal to be delayed dramatically.

It is known to enlarge the size of the load transistors M4 and M5 in order to increase the current in the differential amplifier. Unfortunately, this can dramatically increase the amount of current which flows in the differential amplifier during the standby state, when a logic level transition is not occurring. This increase in standby power is undesirable, especially for portable power devices. Other known techniques can vary the level of the reference voltage Vref. However, this can require complex circuits, and can adversely affect the buffering of the input voltage.

SUMMARY OF THE INVENTION

It is therefore an object of the present invention to provide a high performance input logic signal buffer circuit.

It is another object of the present invention to provide an input logic signal buffer circuit which maintains high performance at reduced power supply voltages.

It is still another object of the present invention to provide an input logic signal buffer circuit which provides high performance without requiring high standby power.

These and other objects are provided according to the present invention by input logic buffer circuits which include a differential amplifier, responsive to an input logic signal and to a reference signal, to produce an output logic signal at an output node thereof, and which also include a bypass amplifier which is electrically connected between the input logic signal and the output node. The bypass amplifier supplies additional current to the output node in response to logic level transitions of the input logic signal. By supplying additional current to the output node during logic level transitions, delays at low power supply are reduced or eliminated without requiring excessive standby dissipation.

The bypass amplifier preferably comprises a field effect transistor having a controlling electrode (gate) and a pair of controlled electrodes (source and drain) wherein the controlling electrode is electrically connected to the input logic signal and one of the controlled electrodes is electrically connected to the output node. A current limiter may also be included in the bypass amplifier, electrically connected to the other of the controlled electrodes. The current limiter may be a resistor, a field effect transistor or another conventional current limiter. An input logic signal buffer circuit according to the present invention may also include a buffer amplifier which is connected to the output node to produce a buffered output signal from the output logic signal.

A preferred embodiment of an input logic signal buffer circuit according to the invention includes a first field effect transistor, the source and drain of which are serially electrically connected between a first reference voltage (such as the power supply voltage) and a first node. The first field effect transistor provides a current source. Second and third complementary field effect transistors include sources and drains which are serially electrically connected between first node and a second reference voltage (such as ground voltage) to define a second node therebetween. The gate of the second field effect transistor is electrically connected to a third reference voltage. The input logic signal buffer circuit also includes fourth and fifth complementary field effect transistors, the sources and drains of which are serially electrically connected between the first node and the second reference voltage, to define a third node therebetween. The gate of the fourth field effect transistor is electrically connected to the input logic signal. The gates of the third and fifth transistors are also electrically connected to the second node so that the third and fifth transistors act as load transistors.

According to the invention, a sixth field effect transistor and a current limiter are serially connected between the third node and the second reference, and the gate of the sixth transistor is electrically connected to the input logic signal. The current limiter may be a resistor, a field effect transistor or other device(s). Accordingly, an output logic signal is produced at the third node based on differential amplification of the third reference voltage and the input logic signal. A buffer amplifier is also preferably electrically connected to the third node to provide a buffered output logic voltage signal. The second and fourth field effect transistors are also preferably of the same conductivity type having differing threshold voltages. High performance input logic signals are thereby provided, which maintain high performance at reduced power supply voltages and which do not require high standby power.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 2:
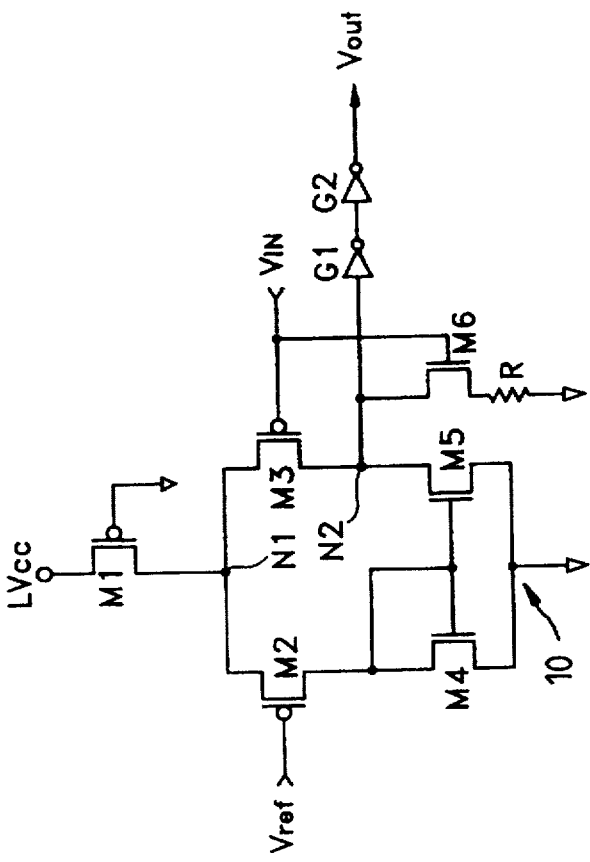
FIG. 2 is a circuit diagram of an input buffer according to the present invention.
Figure 1:
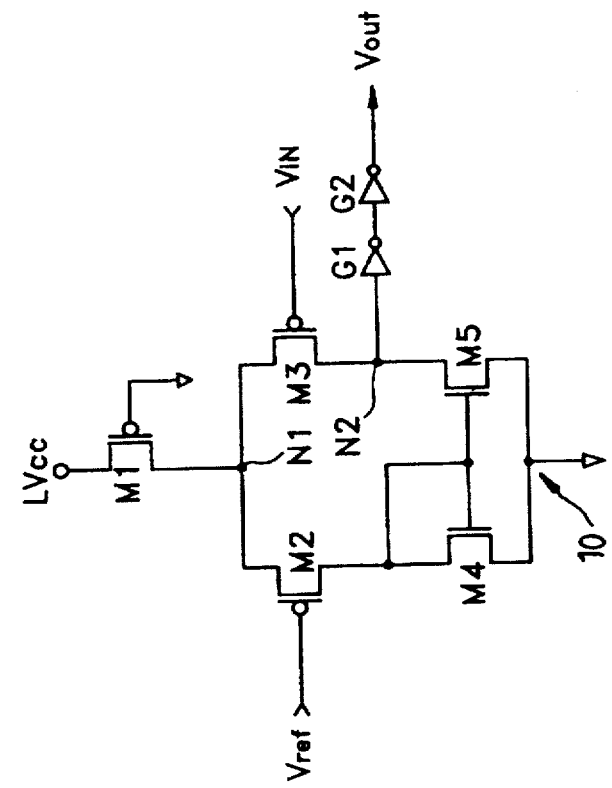
FIG. 1 is a circuit diagram of a conventional input buffer.

Referring now to FIG. 2, an input buffer of a differential amplification type according to the present invention includes a current source transistor M1 connected between a power supply voltage LVcc and a common source node N1. A first transistor M2 includes a gate connected to a reference voltage Vref. Transistor M2 and a first load transistor M4 are electrically connected in series between the common source node N1 and ground 10. Buffering units G1 and G2 buffer the drain output of the second transistor M3 at output node N2 in order to supply an output logic voltage signal Vout to an internal or external circuit.

A bypass transistor M6 includes a gate for receiving the input signal VIN, a source which is grounded through a current limiter, here a resistor R, and a drain connected to the drain of the second transistor M3 at output node N2. The bypass transistor provides a bypass amplifier electrically connected between the input logic signal and the output node N2, which supplies additional current to the output node in response to logic level transitions at the input logic signal.

In particular, the first transistor M2 and the first load transistor M4 form a first current path, and the second transistor M3 and the second load transistor M5 form a second current path. The gates of the first and second load transistors M4 and M5 are connected to the drain of the first transistor M2.

According to the present invention, the bypass transistor M6 and a current limiting resistor R enhance the transfer characteristic of the input buffer circuit. The output signal response to rising and falling transitions of the input signal is almost simultaneously generated with the input signal, to enhance the response characteristic of an input buffer according to the present invention.

Referring now to FIGS. 2 through 6, operation of the circuit of FIG. 2 will be described in more detail. For TTL logic levels, in which the logic high voltage of VIN is 2.0V and the logic low voltage of VIN is 0.8V, it is assumed that a reference voltage Vref of the input buffer is 1.4V. During the falling transition of the input signal, the second transistor M3 has a threshold voltage of 0.8V, while the first transistor M2 has the same threshold voltage as the reference voltage. Thus, the second transistor M3 having a threshold voltage which is relatively lower than that of the first transistor M2 is more rapidly turned on than the first transistor M2, so that the potential of the node N2 becomes a high logic state.

During the rising transition of the input, the first transistor M2 is more rapidly turned on than the second transistor M3. The current-mirrored second load transistor M5 is turned on and the potential of the node N2 slowly changes to the low logic state. According to the invention, however, charging of node N2 by the bypass transistor M6 rapidly changes the potential of node N2 to the logic low state.

Figure 6:
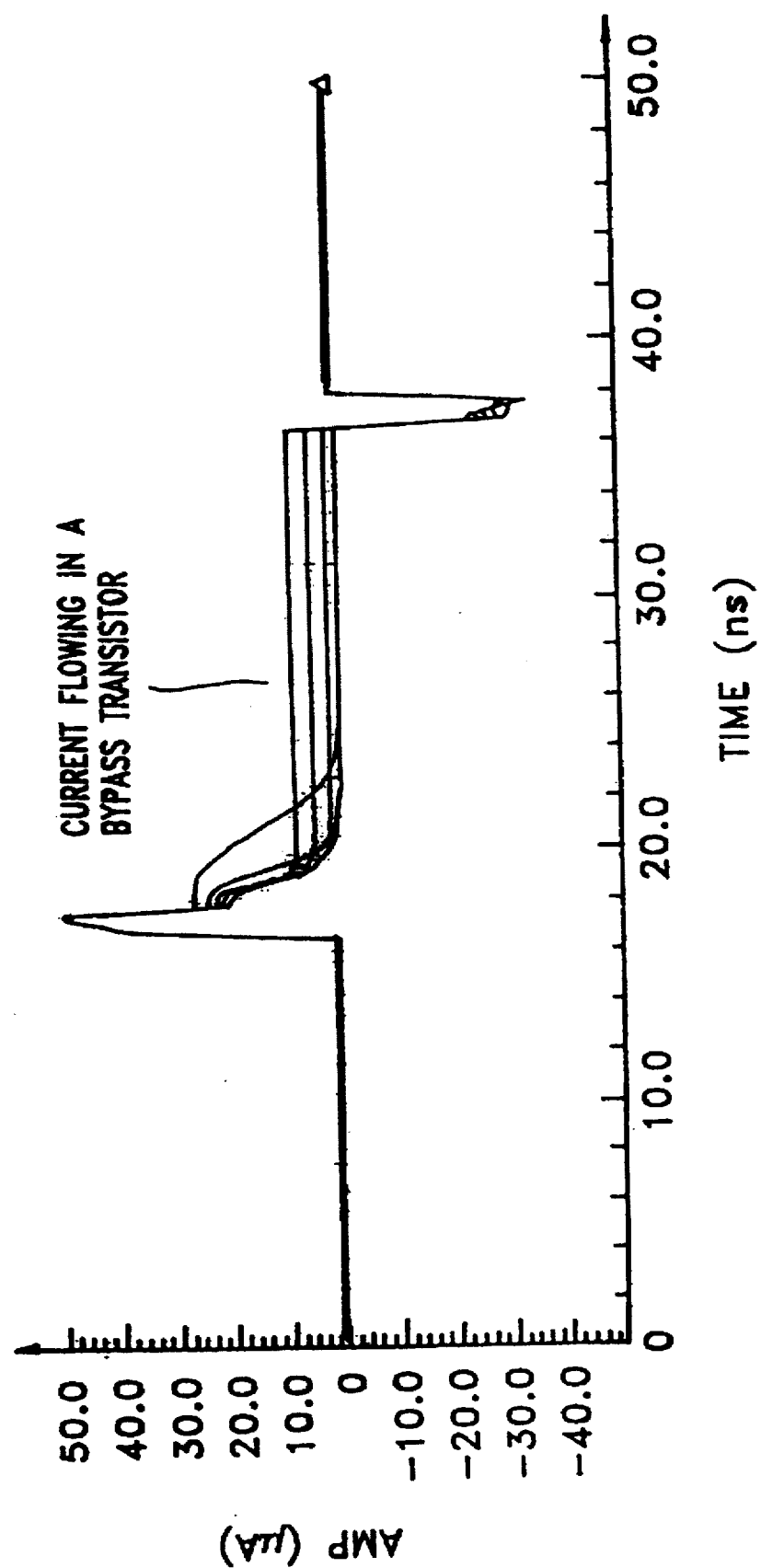
FIG. 6 is a graph showing the current flowing through a bypass transistor according the present invention.

The resistor R increases immunity to noise, and controls of the amount of the bypassed current, for example to a range of 30 μA–50 μA. The resistor can be formed of a MOS transistor or other device. When the input signal is maintained at logic high, a standby current of approximately 5 μA flows as shown in FIG. 6, while little current flows when the input signal is at logic low. Moreover, when used with a high power supply voltage, large currents and small delays are produced. As a result, the overall input buffer performance is not adversely influenced by the bypass transistor.

Figure 3:
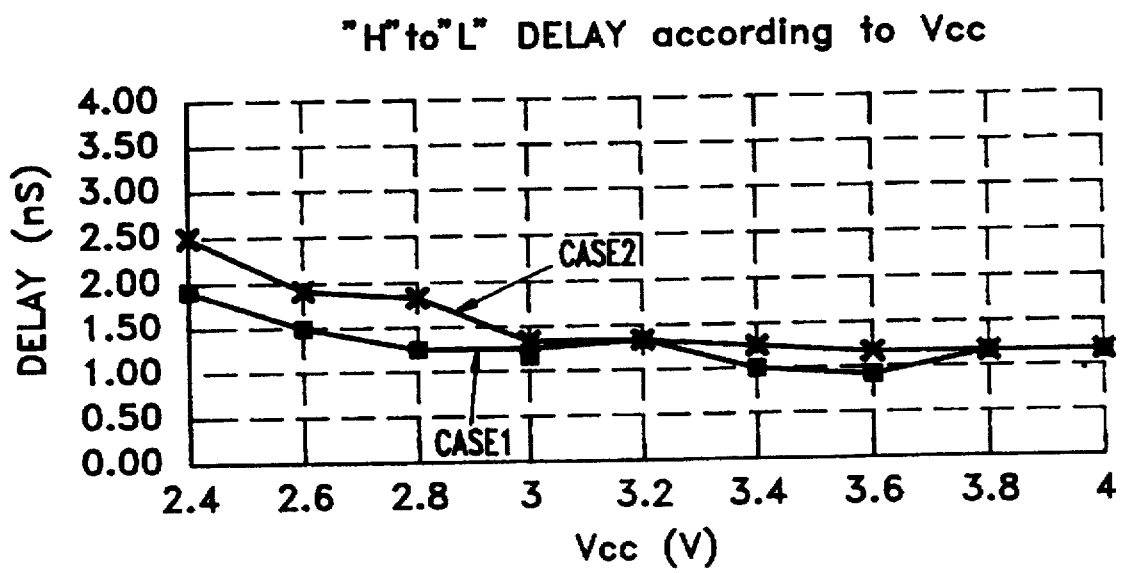
FIG. 3 is a graph showing a comparison of delay characteristics during the falling transition of an input logic signal due to a change of the power supply voltage in a conventional input buffer and in input buffer according to the present invention.
Figure 4:
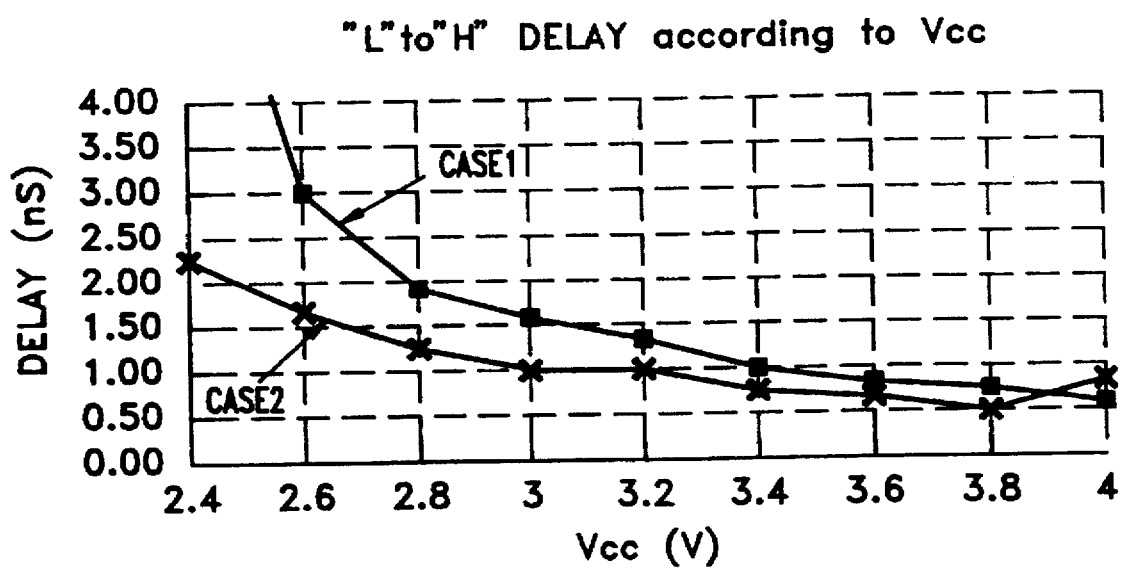
FIG. 4 is a graph showing a comparison of delay characteristics during the rising transition of an input logic signal due to a change of the power supply voltage in a conventional input buffer and an input buffer according to the present invention.

Referring now to FIGS. 3 and 4, in a conventional input buffer, designated as CASE1, the speed of the output signal response to the falling transition of the input signal at 2.4V (Vcc) is 1.93 nanoseconds and the response to the rising transition of the input signal is more than 4 nanoseconds. Thus, in the conventional buffer, the output signal is delayed. However, according to the present invention, designated as CASE2, the speed of the output signal response to the falling transition of the input signal at 2.4V (Vcc) is 2.5 nanoseconds and the response to the rising transition of the input signal is 2.26 nanoseconds. Accordingly, in the present invention, the output signal is not delayed significantly.

Figure 5:
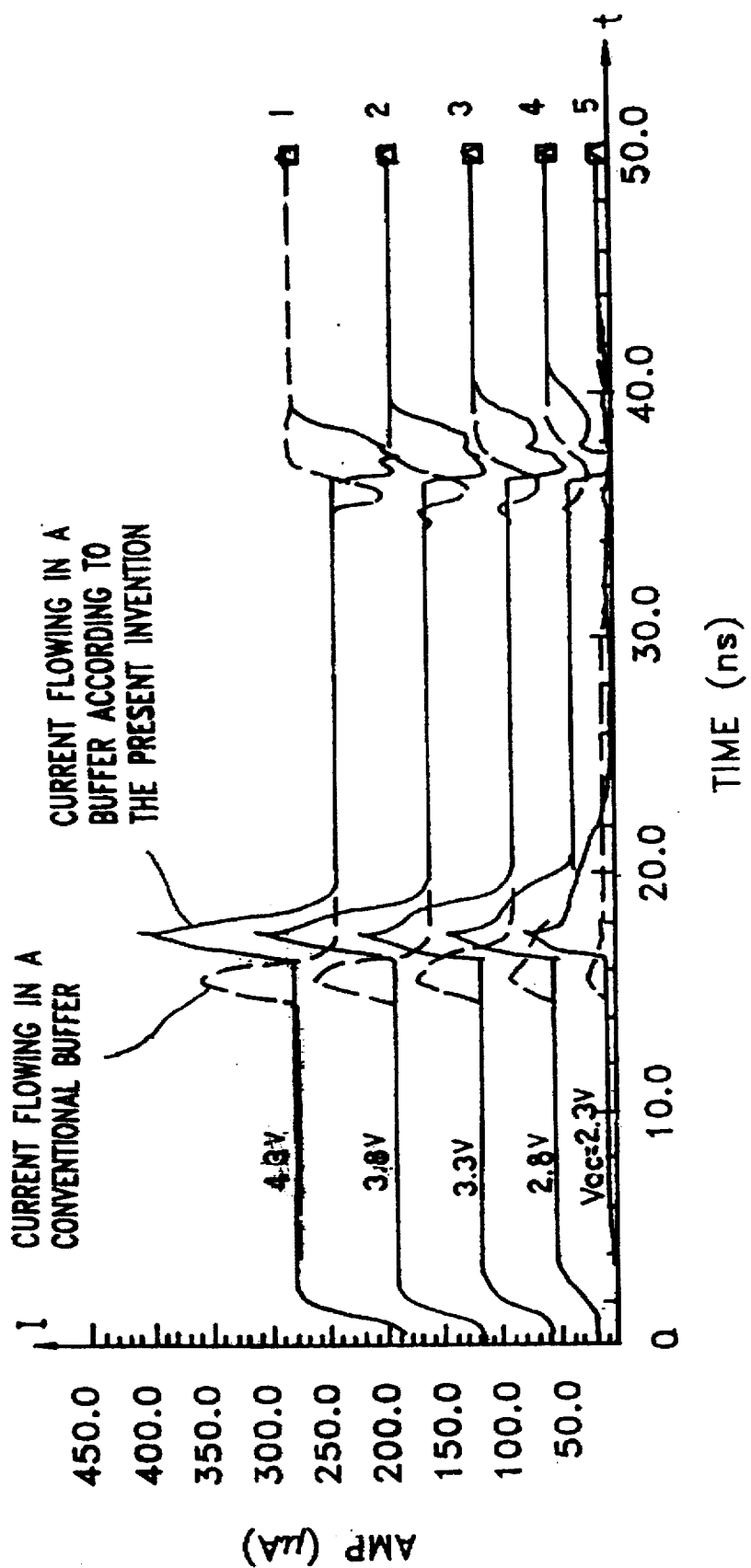
FIG. 5 is a graph showing current waveforms of the current flowing through a differential amplifier transistor with respect to a change of the power supply voltage in a conventional input buffer and an input buffer according to the present invention.

As shown in FIG. 5, the present invention increases the current flowing in the input buffer, to thereby reduce delay of the output signal when using a low power supply voltage.

Accordingly, in an input buffer of the differential amplification type according to the present invention, a bypass path is formed so that the transition of the output signal proceeds rapidly in response to the input signal during the rising transition of the input signal to thereby improve performance and prevent improper operation of other circuits in the system.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An input logic signal buffer circuit comprising:

a differential amplifier, responsive to an input logic signal and to a reference signal, to produce an output logic signal at an output node thereof; and a bypass amplifier, electrically connected between said input logic signal and said output node, said bypass amplifier supplying additional current to said output node in response to logic level transitions of said input logic signal.

2. An input logic signal buffer circuit according to claim 1 wherein said bypass amplifier comprises a field effect transistor having a controlling electrode and a pair of controlled electrodes, wherein the controlling electrode is electrically connected to said input logic signal, and wherein one of said controlled electrodes is electrically connected to said output node.

3. An input logic signal buffer circuit according to claim 2 wherein said bypass amplifier further comprises a current limiter which is electrically connected to the other of said controlled electrodes.

4. An input logic signal buffer circuit comprising:

a differential amplifier including a differential pair of field effect transistors, electrically connected in parallel, responsive to a reference voltage and to an input logic signal to produce an output logic signal at an output node thereof; and a bypass field effect transistor, electrically connected between said input logic signal and said output node, to supply additional current to said output node in response to logic level transitions of said input logic signal.

5. An input logic signal buffer circuit according to claim 4 wherein said bypass field effect transistor includes a controlling electrode and first and second controlled electrodes, wherein said controlling electrode is electrically connected to said input logic signal, and wherein said first controlled electrode is electrically connected to said output node.

6. An input logic signal buffer circuit according to claim 5 further comprising a current limiter, wherein said second controlled electrode is connected to said current limiter to limit the additional current which is supplied to said output node.

7. An input logic signal buffer circuit according to claim 4 further comprising a buffer amplifier which is connected to said output node, to produce a buffered output signal from the output logic signal.

8. An input logic signal buffer circuit according to claim 6 wherein said current limiter is a resistor.

9. An input logic signal buffer circuit comprising:

a current source;

first and second field effect transistors, serially electrically connected between said current source and a first reference voltage, said first field effect transistor having a gate which is electrically connected to a second reference voltage;

third and fourth field effect transistors, serially electrically connected between said current source and said first reference voltage, to define an output node therebetween, said third field effect transistor having a gate which is electrically connected to an input logic signal, wherein said first, second, third and fourth field effect transistors are electrically interconnected to form a differential amplifier which differentially amplifies said second reference voltage and said input logic signal at said output node; and a fifth field effect transistor, the gate of which is electrically connected to said input logic signal, and wherein one of the drain and source of the fifth field effect transistor is electrically connected to said output node.

10. An input logic signal buffer circuit according to claim 9 wherein said current source is a sixth field effect transistor, electrically connected to a third reference voltage.

11. An input logic signal buffer circuit according to claim 9 further comprising a current limiter, wherein the other of said drain and source of said fifth field effect transistor is connected to said current limiter.

12. An input logic signal buffer circuit according to claim 9 further comprising a buffer amplifier which is connected to said output node to produce a buffered output signal from the output logic signal.

13. An input logic signal buffer circuit according to claim 11 wherein said current limiter is a resistor.

14. An input logic signal buffer circuit comprising:

a first field effect transistor, the source and drain of which are serially electrically connected between a first reference voltage and a first node;

second and third complementary field effect transistors, the sources and drains of which are serially electrically connected between said first node and a second reference voltage to define a second node therebetween, wherein the gate of said second field effect transistor is electrically connected to a third reference voltage;

fourth and fifth complementary field effect transistors, the sources and drains of which are serially electrically connected between said first node and said second reference voltage to define a third node therebetween, wherein the gate of said fourth field effect transistor is electrically connected to an input logic signal, and wherein the gates of said third and fifth field effect transistors are electrically connected to said second node; and a sixth field effect transistor and a current limiter serially connected between said third node and said second reference voltage, wherein the gate of said sixth field effect transistor is electrically connected to said input logic signal.

15. An input logic signal buffer circuit according to claim 14 wherein said current limiter is a resistor.

16. An input logic signal buffer circuit according to claim 14 wherein said current limiter is a field effect transistor.

17. An input logic signal buffer circuit according to claim 14 further comprising:

a buffer amplifier, electrically connected to said third node, to provide an output logic voltage signal.

18. An input logic signal buffer circuit according to claim 14 wherein said second and fourth field effect transistors are of same conductivity type, but have different threshold voltages.

* * * * *